United States Patent [19]

Kimerling et al.

[11] 4,238,694
[45] Dec. 9, 1980

[54] HEALING RADIATION DEFECTS IN SEMICONDUCTORS

[75] Inventors: Lionel C. Kimerling, Westfield; Harry J. Leamy, New Providence; George E. Smith, Murray Hill, all of N.J.

[73] Assignee: Bell Telephone Laboratories, Incorporated, Murray Hill, N.J.

[21] Appl. No.: 799,456

[22] Filed: May 23, 1977

Related U.S. Application Data

[63] Continuation of Ser. No. 605,233, Aug. 18, 1975, abandoned.

[51] Int. Cl.$^2$ .......................................... H01L 21/263
[52] U.S. Cl. .................................. 307/238; 29/585; 357/23; 357/29; 357/45; 357/91; 365/104
[58] Field of Search ................... 357/23, 22, 41, 29, 357/45, 63, 64, 88; 307/304, 238; 365/103, 104; 29/584, 585

[56] References Cited

U.S. PATENT DOCUMENTS

| | | | |
|---|---|---|---|
| 3,465,292 | 9/1969 | Schilling et al. | 357/45 |
| 3,515,953 | 6/1970 | Schilling et al. | 357/63 |
| 3,691,376 | 9/1972 | Bauerlein et al. | 357/29 |
| 3,914,855 | 10/1974 | Cheney et al. | 357/45 |

OTHER PUBLICATIONS

Lang et al., Phys. Rev. Lett., vol. 33, Aug. 19, 1974, pp. 489–492.
Baruch, J. Appl. Phys., vol. 32, No. 4, Apr. 1971, pp. 653–659.
Kimerling et al., Solid State Communications, vol. 16, pp. 171–174 (1975).

*Primary Examiner*—William D. Larkins
*Attorney, Agent, or Firm*—Peter V. D. Wilde

[57] ABSTRACT

The rate at which radiation defects in semi-conductors are annealed is enhanced by various electronic mechanisms. These effects can be used to program device arrays in which all devices are initially damaged, then selected devices are activated by addressing them electrically through the individual device contacts.

16 Claims, 10 Drawing Figures

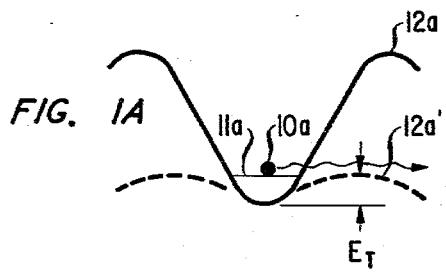
FIG. 1A
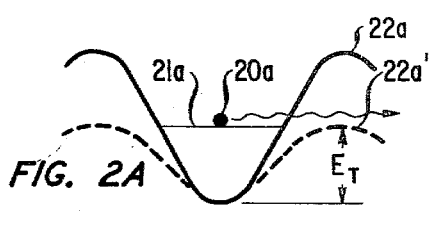
FIG. 2A
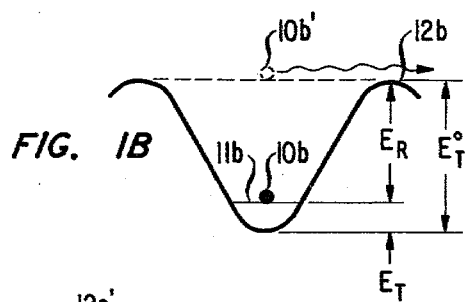
FIG. 1B
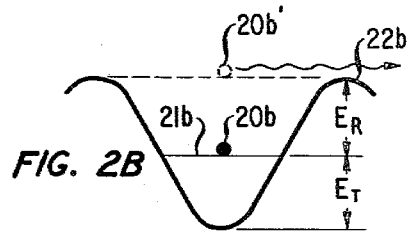
FIG. 2B
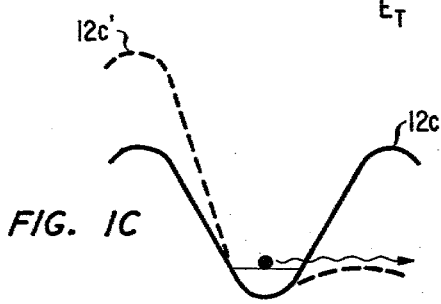
FIG. 1C
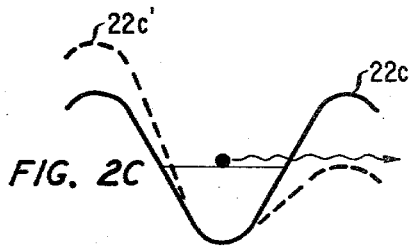
FIG. 2C
FIG. 3
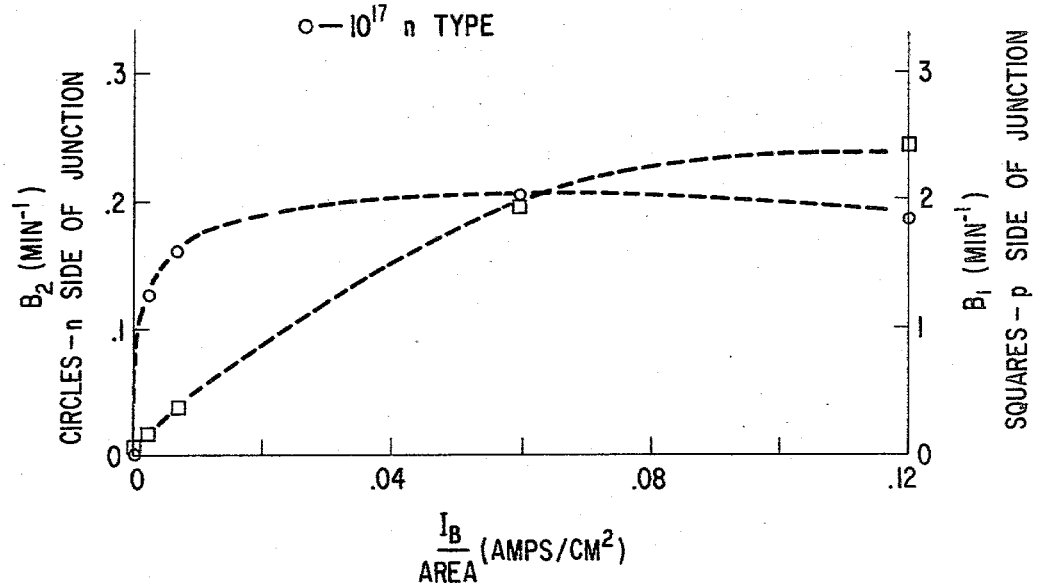
INJECTION LEVEL DEPENDENCE OF THE RECOVERY
RATE IN 1MeV ELECTRON IRRADIATED GA AS
□ — $10^{18}$ Ge DOPED, P TYPE
○ — $10^{17}$ n TYPE

HEALING RADIATION DEFECTS IN SEMICONDUCTORS

This is a continuation of application Ser. No. 605,233, filed Aug. 18, 1975, now abandoned.

BACKGROUND OF THE INVENTION

The semiconductor industry has prospered because of the ability of its technicians to make semiconductor devices ever smaller and often more intricate. They have evolved a constant succession of ingenious ways to process chosen microscopic regions of a larger semiconductor wafer. Advances in this kind of selective area processing are fundamental to the semiconductor arts.

For many years it has been known that the minority carrier lifetime in semiconductor crystals can be reduced significantly by creating displacement damage in the crystal. Since carrier lifetime is an important functional property in many semiconductor devices it has been proposed to use this mechanism for selective treatment of various devices. For example, if the region of a device that is to be active is appropriately masked and the surrounding exposed regions damaged by high energy electrons, ions or equivalent radiation, one can effectively electrically isolate a device, selectively destroy devices in order to program a memory array, create display patterns in electroluminescent bodies, form stripe geometries in heterostructure lasers and do any number of similar selective processes. In some categories of devices, e.g., those often referred to as majority carrier devices and represented most notably by field effect transistors, the important consequence of radiation damage is its effect on the threshold voltage due to changes in the fixed charge and the majority carrier concentration in e.g., a MOSFET, or to the majority carrier concentration along the buried channel of the typical JFET. Both of these electrical characteristics depend on the number of defect states in the semiconductor so that the threshold voltage of selected devices in an array of field effect devices can be modified as desired by selective damage. In all of these procedures the selection depends on a physical mask for the damaging radiation. Mask defects and errors in mask alignment lower device yields, especially with arrays of devices made near the resolution limits of the technology. In the case of a memory array it is possible to re-program the array by annealing the radiation damage and damaging a new set of devices. This requires, obviously, another mask.

The ability to "heal" radiation damage by thermal treatment raises another possibility—that of causing uniform damage in the semiconductor and selectively healing desired regions. This thought is frustrated by the nonselective nature of thermal energy and the time required for the annealing process. At one time it was hoped that the laser would provide a tool for achieving selected area thermal processing. Failures in laser induced diffusion were no doubt matched by similar failures to selectively heal radiation damage. These are accounted for primarily because the heat cannot be confined to the desired area for the length of time required to completely anneal.

According to one aspect of the invention selected areas of a radiation damaged semiconductor are healed by new electronic mechanisms. According to another aspect of the invention selected devices in a device array in which the array has been damaged by radiation are healed by any of several electronic mechanisms. This allows the array to be electrically programmed.

Briefly stated, and to be treated in greater detail below, the three damage healing electronic mechanisms are: 1: charge stated enhancement; 2: carrier recombination enhancement; and 3: electric field enhancement.

Healing selected defects can be achieved by the electronic process alone, or the electronic process can be augmented by thermal treatment. The latter is especially useful if the non-selected devices are likely to experience in service electronic conditions that would, but for the absence of thermal augmentation, heal the damage and activate the device.

The damage healing mechanisms are used advantageously to activate selected semiconductor devices in a device array already formed. The devices to be activated can be selected electrically via the electrode contacts to the completed devices. This selection process (or coding process in the case of a memory array) is 100% reliable whereas using the inverse mechanism of selection by damaging certain devices of a "good" array (referred to earlier) involves potential masking failures.

DETAILED DESCRIPTION OF THE INVENTION

BRIEF DESCRIPTION OF THE DRAWINGS

FIGS. 1A, 1B and 1C are schematic representations of a defect in three different electronic environments within a semiconductor crystal. These illustrations aid in describing the three basic mechanisms for removing such defects from a selected area of the bulk semiconductor.

FIGS. 2A, 2B and 2C are schematic representations similar to those of FIGS. 1A-1C showing the same defects in the same environments except that the energy of the defect is thermally augmented.

FIG. 3 is a plot of the annealing rate vs electron exposure for recombination enhanced annealing in GaAs.

FIGS. 1A-1C illustrate schematically a defect within a semiconductor crystal and lying within an energy well represented by the heavy line. Relative energy E is the ordinate with any dimension in free space the abscissa. The defects of interest are those with energy states lying within the energy gap that cause recombination and thereby affect the functional properties of the semiconductor in the way we wish to control. These deep states can be introduced into the crystal by exposing the crystal to moderately high energy radiation of a variety of kinds. This kind of damage mechanism and the character of the energy capable of producing the damage are well known in the art.

Figure 4A:
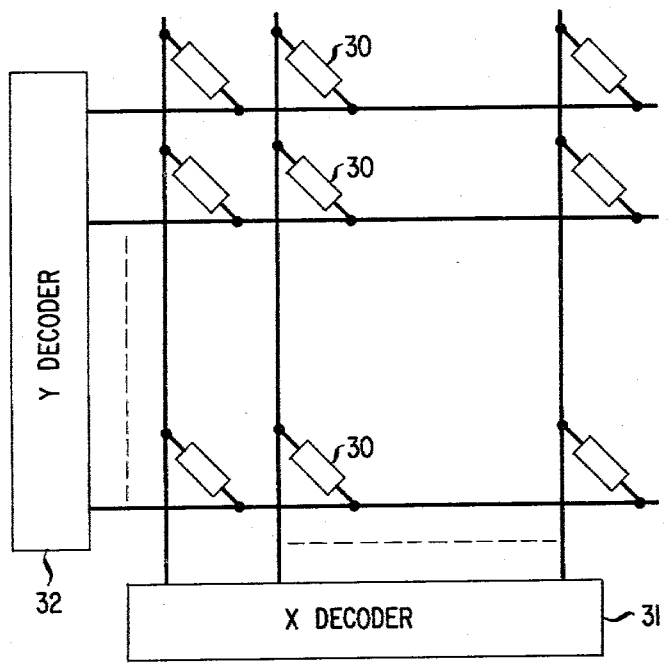
FIGS. 4A and 4B are schematic representations of device arrays to which the invention may advantageously be applied.

The states represent lattice defects related to displaced atoms—vacancies and interstitials. An atom is displaced from its normal lattice position when it receives energy equivalent to its displacement energy, $E_D$. Typical values for $E_D$ in semiconductors scatter about 15 eV.

The efficiency of energy transfer depends on the mass of the bombarding particle relative to the mass of the lattice atom. Hence, each particle has an associated threshold energy, $E_{th}$, below which no damage can be effected. For electrons and gamma rays, $E_{th}$ has values of ~200 keV for silicon and ~400 keV for germanium and gallium arsenide. For protons and heavier particles, displacements result from almost any energy capable of penetrating the solid.

Each type of radiation has a unique range. Gamma rays are highly penetrating and will create uniform damage throughout wafer thicknesses of any semiconductor material. Electrons have a shorter range but can still penetrate typical device dimensions with uniform damage—e.g., tens of microns in Si and GaAs (1 MeV electrons). Heavier particles have a shorter well-defined range. For light particles, protons and alpha particles, the damage is created only at the end of the range, imparting only a fraction of the initial particle energy. This property can be exploited in buried layer devices, for three dimensional writing schemes, or for protection of shallow or deep regions.

The nature of the bombardment defects depends, somewhat, on the type of radiation. Simplest defects are produced by near threshold electrons and gamma rays. As the particles get heavier or the energy gets higher, the damage gradually becomes more complex because multiple displacements become probable. The simpler defects are most susceptible to electronic annealing because; one, they move most easily; and two, they are able to make most efficient use of the electronic energy. It is, therefore, beneficial if simple defects dominate the assortment of radiation produced defects. This requirement suggests a rather soft preferred limit to the process of damage by electrons and gamma rays of energy 155 10 MeV and positive ions no heavier than alpha particles.

The density of defects needed to produce the desired destructive effect on the operation of devices in an otherwise functional array will depend on the kind of device and the extent of impairment necessary. In general we envision damage levels of the order of at least 50% more than the intrinsic defect level of the semiconductor, although useful effects may be found with lower levels.

The number of defect states that should be annealed to give a useful process depends upon the electrical characteristic of the semiconductor that is being modified. For devices that depend strongly on minority carrier lifetime it will ordinarily be adequate to change the defect level by half an order of magnitude or less. Thus if we define a relatively non-functional device as one with a concentration of recombination centers produced by the damage at a level of at least an order of magnitude greater than the normal background level of recombination centers then an active or functional device should have a recombination center concentration of at least half an order of magnitude less.

The relevant recombination events are those that occur at or near the p-n junction which will be defined for the purpose of this invention as the "active" region of the p-n junction. This region normally encompasses the region of carrier diffusion or depletion.

Since the defect states of interest here are those which are effective recombination centers and the minority carrier lifetime is dependent on the frequency of recombination events it is as valid to define the annealing process in terms of this functional property as to define it in terms of defect concentrations. Following this we would prescribe radiation damage sufficient to reduce minority carrier lifetime by one order of magnitude and annealing selected devices to increase (restore) their lifetime by at least half an order of magnitude.

For devices with operating characteristics that are sensitive to majority carrier concentration such as MOSFETs, JFETs, charge transfer devices and diodes (reverse breakdown voltage), among others, relatively smaller changes in defect concentration will have a significant effect on important device parameters. For example the gate pinch-off voltage of a single junction JFET is proportional to $N^{\frac{1}{2}}$. Defects tend to reduce the effective majority carrier concentration by trapping carriers. The E-center defect in slicon typically traps two carriers. Similar effects on threshold exist in MOSFETs although there is an added contribution from surface states.

In fact any device in which a depletion layer can be formed in susceptible to this kind of process. For the purpose of describing such devices by category we use the term barrier layer device to include those devices, especially barrier layers produced by p-n junctions, MOS and Schottky barriers.

It is known that these defects, once created, can be removed effectively from the crystal by thermal annealing. This fact is evident from the diagrams in FIGS. 1A–1C, once it is appreciated that the defects are potentially mobile and bound only by the electronic energy represented by the confining line in the figures. When the defect states are free to move they diffuse until they associate with an impurity or are annihilated by another defect (vacancy+interstitial), or they diffuse from the region of interest. The thermal energy possessed by the defect states in FIGS. 1A–1C is indicated by a displacement $E_T$ from the theoretical ground state, $E_o$, at the recess of the energy confinement line. The defects of interest here are those with insufficient thermal energy to become mobile at room temperature (or slightly above) but yet are capable of being mobilized by one of the electronic mechanisms described here with or without added thermal energy. The electronic mechanisms are of distinctly different kinds as will become evident and the defects themselves can be of different kinds so there is no single well-defined value attached to the energies under discussion. However, defects that are susceptible in general to the treatments described herein can be characterized as those with energy states lying within the band gap of the semiconductor.

Referring again to FIGS. 1A–1C, these diagrams aid in a classical description of the three electronic defect healing mechanisms. The figures illustrate the energy environment for a defect before (solid lines 12a–12c) and after (dashed lines 12a'–12c') the electronic process. The first process to be discussed and depicted by FIG. 1A is termed "charge state enhancement"—enhancement referring to the increase in the rate at which the defects diffuse or disappear from the active regions of the crystal over a purely thermal process. The objective illustrated in FIG. 1A is to lower the activation barrier 12a thus freeing the defect 10a from its site in the desired active region. To do this efficiently it is necessary that the defect lie below the Fermi level with respect to the majority carrier band, but relatively close (within approximately 10kT) to the Fermi level. Then if the Fermi level is lowered electronically to below the energy state of the defect the defect is free to diffuse away from the original defect site. The defect rests always on a "platform" 11a representative of the thermal energy. The enhancement condition is represented by the phantom line 12a'.

We have noted that for this process to be important the Fermi level of the semiconductor crystal in the steady state must lie above the defect at the temperature of the treatment with no electronic stimulation. In silicon this condition is typical for defects associated with the E-center. This kind of defect is a vacancy (produced by the radiation damage) associated with a phosphorous dopant atom. This defect lies approximately 0.4 eV below the conduction band and the Fermi level intervenes for dopant levels above $10^{15}$ carriers/cm$^3$, a common level in silicon. We have not identified definitively corresponding charge state enhancement processes in other semiconductors although it is not unlikely that they exist.

It is relevant that other impurities in silicon crystals, notably oxygen, compete for the vacancy defects thus reducing the concentration of the E-center complex of interest. It is known that these defects are less prevalent in quartz crucible grown silicon than in float-zone silicon due presumably to the difference in oxygen content. Oxygen levels in silicon, even silicon that has been processed (SiO$_2$ covered) rarely exceed $10^{18}$ atoms/cm$^3$ at which level a usable concentration of E-centers remain for these dopant levels.

There are at least two important practical ways in which the Fermi level can be changed with respect to the energy level of the defect state and thus affect the charge state. The net carrier concentration of the semiconductor in the vicinity of the defects of interest can be altered thus shifting the Fermi level within the band gap. This kind of effect and ways to achieve it are well known. Changing the static equilibrium with permanent charge carriers is clearly effective but in many cases undesirable since it affects the operating characteristic of the device. One could, however, alter the initial processing of the devices to compensate for this step. However, as long as the net carrier concentration is altered via charges introduced into the crystal from an external source the selection process will involve masking or critical beam position control. As indicated before a preferred goal of the invention is to avoid this kind of processing.

Another way of adjusting the net carrier concentration is to create a quasi-Fermi level by injecting minority carriers. Excess carriers can be injected by exposing the semiconductor to photons with energy greater than the band gap, or by exposing the semiconductor to a flux of charged particles, such as electrons, protons, alpha particles, etc. However, again, this involves some kind of masking procedure. A preferred way is to inject carriers by forward biasing a junction formed in the semiconductor.

Alternatively another preferred way of affecting the charge state of the defect is to reverse bias the p-n junction. This depletes a portion of the semiconductor and pins the Fermi level at mid gap and will change the charge state of any defect lying between mid gap and the equilibrium Fermi level. Since one of the uses suggested for this mechanism is for programming an array of memory devices, and such devices typically contain one or more junctions, enhanced annealing of defects by this mechanism at devices selected by the already existing address circuitry is straightforward.

The second electronic process that can be used according to the invention to accelerate the healing of radiation caused defects is termed here "recombination enhancement". This mechanism can be appreciated with the aid of FIG. 1B. The defect state 10$b$ lies again in a deep trap although on a "platform" 11$b$ representative of the thermal energy. The activation barrier is represented again by the line 12$b$. We have found that recombination events occurring at the site of the defect can transfer to the defect, energy equivalent to the activation barrier. This process is represented in phantom in FIG. 1B. The energized defect 10$b'$ is then disposed of, as before, by diffusion from the active region or by annihilation.

The conditions under which this energy transfer occurs are not severe or unusual in common semiconductor materials. It is necessary that the defect be a recombination center and accommodate non-radiative electronic transitions through local electron-phonon coupling. The latter property is characteristic of defects in ionic semiconductors. The energy transferred in this process should be significant compared with the activation energy, i.e., the energy that binds the defect to its spatial site, otherwise the dominant healing mechanism will be thermal. For this reason, large band gap semiconductors are more susceptible to electronic annealing. Point defects rather than defect clusters are able to make most efficient use of the energy transfer. Finally, since the energy transferred via the recombination mechanism is to be high compared with normal thermal excitation rates, large numbers of recombination events are desired, suggesting that high carrier injection levels and relatively high majority carrier concentrations are preferred. The capture cross section of the defect also governs recombination efficiency.

Recombination of carriers within the semiconductor can be accomplished in a variety of ways known in the art, all of which rely on injection of minority carriers into the semiconductor. Exposing the semiconductor to photons of energy greater than the band gap, for example, light, x-rays, gamma rays, will generate electron-hole pairs for recombination events. Direct injection of minority charges by exposure of the semiconductor to a flux of charged particles (electrons, protons, alpha particles) will produce similar results. However, in either case the exposure process will require a masking procedure in order to obtain selectivity. A preferred method for producing recombination enhancement is to inject carriers directly at the defect sites of interest through the electrodes of the device that is to be activated. In this way the healing process is restricted precisely to the region of the semiconductor in which the carrier lifetime is to be recovered. If the device includes a junction injection may be conveniently accomplished by forward biasing the junction (or less conveniently by avalanching). Since this recombination enhancement process meets our selectivity criterion it is evident that the practice of this embodiment of the invention is applied preferably to junction devices.

The third electronic annealing mechanism, electric field effects, depend on the existence of charged defects. (If the defect is not charged it may still be susceptible to enhanced annealing by the charge state mechanism described earlier or it may be charged by exposure of the semiconductor to light). The charge on a given defect is related to its state of occupation which is, in turn determined by the position of the Fermi level. It is known that such a defect will drift under the influence of an electric field. See E. M. Pell, *Phys. Rev.* 119, 1222 (1960), *J. Appl. Phys.* 32, 1048 (1961), and P. Baruch, *J. Appl. Phys.* 32, 653 (1961). This mechanism is illustrated in FIG. 1C wherein the defect 10$c$ lies within an activation barrier 12$c$ that is lowered (12$c'$) in the direction of the field.

The electric field is established conveniently by forming a depletion layer in the semiconductor. It will be appreciated that any device that is capable of supporting a significant depletion region can be processed in accordance with this mechanism. Such devices can be considered to be "barrier layer devices" as that term was defined earlier.

The enhancement factor due to the electronic contribution can be defined as $$R_{EF}/R_o = qV/kT \quad \text{(Eq. 1)}$$

where $R_{EF}$ is the rate of annealing with the field applied, $R_o$ is the normal annealing rate, q is the charge of an electron, V is the voltage applied across the depletion region, and kT is the Boltzman expression. Assuming for example that the defect is a divacancy that anneals near 600° K., a voltage of 100 volts applied to the device will enhance the annealing rate by a factor of $2 \times 10^3$.

Any of these mechanisms can be enhanced by heating the semiconductor during processing. The thermal contribution, depicted schematically in FIGS. 1A–1C as the platform 11, is raised in FIGS. 2A–2C so that the activation process that "frees" the defect state occurs more readily, i.e., on a statistical basis either more quickly or with less electronic stimulation. The reference numerals in FIGS. 2A–2C correspond directly with those of FIGS. 1A–1C except for the tens digit. At significantly elevated temperatures the thermal annealing rate is sufficiently large or the normal thermal cycle may be comparatively so long that any electronic contribution may be unimportant, or it may prohibit the selectivity necessary to practice the invention. Such possibilities become real at temperatures above 200° C. for silicon and 250° C. for III–V semiconductors such as GaAs, and GaP for the defect states described.

We have observed charge state enhanced annealing in silicon and recombination enhanced annealing in the III–V semiconductors GaAs, GaP and GaAlAs, GaAlAsP. Based on these observations one would predict that recombination enhanced mechanisms exist in GaAsP or any III–V semiconductor based on Ga. It is also possible that recombination enhanced annealing can be made to occur in silicon. In theory any semiconductor should be susceptible to the treatments outlined here.

We have earlier acknowledged that thermal annealing of damage defects is well known in the art. Therefore it is useful to compare the conditions under which the electronic annealing processes of this invention dominate the thermal processes. Thermal processes will always exist even at room temperature. In those cases (still regarded as within the scope of the invention) in which the temperature of the semiconductor is intentionally raised to aid the electronic annealing process it is helpful to define conditions that ensure a significant electronic contribution.

Consider the mechanism of recombination enhancement since that turns out to be the easiest comparison to quantify. Thermal recombination events are described by:

$$R_{th} = \frac{\nu}{N_j} \exp\left[-\frac{E_a}{kT}\right] \quad \text{Eq. (2)}$$

where $R_{th}$ is the thermal recombination rate, $\nu$ the frequency with which the defect state attempts a movement, $N_j$ the number of movements of annihilation, and the exponential expression, which defines the probability of a successful attempt, includes the terms $E_a$, the activation energy, and kT the familiar Boltzman expression.

Recombination events that are electronically stimulated are expressed by:

$$R_R = \frac{R\eta}{N_j} \exp \frac{-(E_a - E_R)}{kT} \quad \text{(Eq. 3)}$$

where R is the recombination rate, $\eta$ is the efficiency factor and $E_R$ is the energy of the contributing electronic transition involved in the recombination event.

For the electronic mechanism to predominate $R_R/R_{th}$ should be greater than one.

Combining the prior equations yields:

$$\frac{R\eta}{\nu} \exp \frac{E_R}{kT} > 1 \quad \text{(Eq. 4)}$$

Assuming typical values for $\eta$ as $10^{-3}$ and $\nu$ as $10^{13}$, T is 300° K. and the energy of the transition of interest is 1.0 eV, R the recombination rate is $1.6 \times 10^{-1}$. This recombination rate can be translated into an injection level using:

$$R = \sigma \nu n \quad \text{(Eq. 5)}$$

where $\sigma$ is the cross section for capture of the rate limiting carrier, v is the thermal velocity of the carrier and n is the volume concentration of the rate limiting carrier, and R the rate needed to produce the desired number of recombination events. When the cross section for capture of the minority carrier is greater than that of the majority carrier, $\sigma_{min} > \sigma_{maj}$, R will saturate at an injection level defined by the condition $\sigma_{min} v_{min} n_{min} = \sigma_{maj} v_{maj} n_{maj}$. In this case the majority carrier concentration, $n_{maj}$, will determine the upper limit of R. When $\sigma_{min} > \sigma_{maj}$, R is controlled by the injection level, $n_{min}$. (The example which follows is for $\sigma_{min} > \sigma_{maj}$.) Typical values for $\sigma$ and v are $10^{-15}$ cm$^2$ and $10^7$ cm/sec (at 300° K.). For the defect state at 1.0 eV the injection level necessary to produce $1.6 \times 10^{-1}$ recombinations is approximately $1.6 \times 10^7$ carriers/cc.

While this injection level is sufficient for the electronic annealing mechanism to predominate over the thermal mechanism we have found that for GaAs, a semiconductor that yields typical defects lying at 1.0 eV from the valence band, an acceptable annealing rate is obtained when the injection level is at least $10^{14}/\text{cm}^3$. This corresponds to a current density of 1 amps/cm$^2$.

We have observed electronically enhanced annealing in GaAs at room temperature. Duration of essentially complete annealing is of the order of one hour. The treatment time can be reduced drastically by increasing the temperature. The treatment time also varies with the semiconductor being annealed. GaP anneals very rapidly, in less than one second.

Note that the temperature term enters similarly in both the thermal annealing equation and the recombination enhanced annealing equation. This suggests that to a first approximation, the mechanism that predominates will continue to predominate over a wide temperature range, although the contribution of each will increase. Therefore the prescription of Expression 4 is valid to first order for temperatures of interest.

As indicated before, the preferred way of injecting the necessary carriers is by forward biasing a p-n junction already formed in the semiconductor, a process that does not rely on a selective masking step. Electrons can be injected directly into the semiconductor very selectively by an electron beam even though it is necessary to use a masking process or to accurately control the beam position. The electron beam technology is capable of very high resolution and reliability and could become a desirable way of implementing the invention described here. Therefore it will be considered as an embodiment of the invention and deserves more rigorous consideration.

When high energy electrons penetrate into a solid, they undergo both large angle elastic (Rutherford) scattering as well as small angle anelastic scattering. Between large angle collisions, the electrons thus follow straight line paths along which they are continuously slowed down via anelastic events which include the formation of e-h pairs. The large angle scattering leads to a lateral spreading of the beam within the specimen. There exists good experimental evidence that the carrier generation rate is well described by a universal function: $N(x,y,z)$ when the dimensions are normalized by the Grün range for electrons, $R_G$. $R_G$ is given by 4.0 $E_B$ (keV) $1.75/\rho$. The injection source provided by an electron beam is thus proportional to the inverse density of the material and the beam energy, $E_B$, to the 1.75 power. The depth-dose relationship obtained from:

$$N(z) = \int\int N(x,y,z)dxdy \qquad \text{(Eq. 6)}$$

Electron injection provides a method to control both the depth, and width of the recovery volume by variation of $E_B$.

The electron beam injection source must be convolved with the drift or diffusion motion of the carriers that occurs during their lifetimes. Since carriers lifetime increases during recovery, the ultimate resolution of a fully recovered pattern will be governed by the diffusion length of the minority carriers.

Maximum recovery rates will be achieved at saturation injection levels and will thus be proportional to the uncompensated dopant level (or to the injection level if saturation does not occur). These are described quantitatively by the data given in FIG. 3 with exposure time to recovery plotted against exposure. Maximum resolution will be achieved when shallow recovery depths may be tolerated by injection of lower energy electrons to produce a small fractional recovery. In general, all of the current electron beam (and x-ray) technology may be used to advantage in this application.

The charge state enhancement mechanism seems to be important primarily for silicon although we have not exhausted the possibilities for any of the mechanisms described here for all semiconductors. The displacement damage defects in phosphorous doped silicon are typically vacancy-phosphorous pairs that lie approximately 0.4 eV from the valence band. The object of this enhancement mechanism was described earlier as creating a quasi-Fermi level by reverse bias depletion or carrier injection that moves through the defect with respect to the conduction band thereby changing the charge state of the defect.

The way of achieving this, including the electronic conditions are straightforward to those skilled in the art. For example, if the semiconductor is n-type silicon with a total carrier concentration: $nxp = 10^{20}$ cm$^{-6}$, and a majority carrier concentration of $10^{15}$ the equilibrium Fermi level lies at about 0.25 eV. If the injection level is, for example, $10^{15}$ carriers/cm$^3$ then the minority carrier concentration changes from $10^5$ cm$^{-3}$ to approximately $10^{15}$ cm$^{-3}$ while the majority carrier concentration simply doubles. This shifts the quasi-Fermi level for minority carriers to 0.75 eV having been driven through the 0.4 eV level of the defect state. The charge on the defect is thereby changed and the defect is free to move to annihilation.

Thus we have seen that an injection level equal to the majority carrier concentration is easily sufficient to reach the desired result.

In silicon, where the common defects lie near mid gap (0.5 eV) it is necessary to "move" the Fermi level by approximately 0.25 eV or more. Taking a low resistivity material, $n = 10^{16}$ cm$^{-3}$, as an example in order to define the normally useful operating conditions, the charge state of the defect will be changed by an injection level of at least $10^{11}$ cm$^{-3}$.

We have observed empirically that electronically enhanced annealing in silicon proceeds at a reasonable rate at temperatures of at least 100° C. and with a minimum carrier injection level of two orders of magnitude below the lowest majority carrier concentration at the p-n junction. Using this prescription this minimum injection level for high resistivity silicon, e.g., where $N = 10^{13}$cm$^3$, would again be $10^{11}$ carriers/cm$^3$. From the annealing rate equations given earlier it is evident that the annealing rate increases rapidly with increasing temperature. We have found that E-center defects in silicon anneal rather completely in one hour at 100° C.

We have observed also charge state enhanced annealing of silicon by reverse biasing a barrier in the manner described earlier. For example, we have found that for silicon at 100° C. doped with $5.10^{15}$ phosphorous/cm$^3$ and with a reverse bias of 20 volts on a Schottky barrier we were able to remove selectively E-center defects from depleted regions, in the case regions extending approximately 4 microns under the junction.

A variety of devices can be processed by these electronic annealing mechanisms.

Typically the devices of primary interest will be p-n junction devices, defined here as simply any semiconductor device containing a p-n junction, and MOS devices, defined as any semiconductor device containing a functional MOS barrier. Other kinds of semiconductor devices such as photoconductor devices, Gunn effect devices, Schottky barrier devices and charge transfer devices can be treated by the mechanisms described here, but for reasons of commercial impact this description deals primarily with junction- and MOS-devices.

While discrete devices can be damaged and healed using the electronic healing mechanisms described here it is more likely that the invention will be applied commercially to large arrays of devices, both monolithic arrays and complex integrated circuits. The application that appears now most likely is the use of these mechanisms for coding memory arrays. Following these predictions we set forth here a specific treatment of this use, as applied to both bipolar and MOS memory arrays. It will be understood that the invention is not so limited.

Figure 4B:
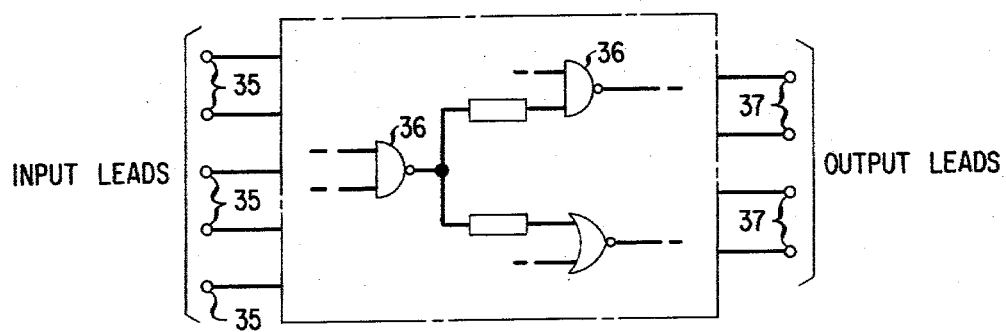
Figure 5:
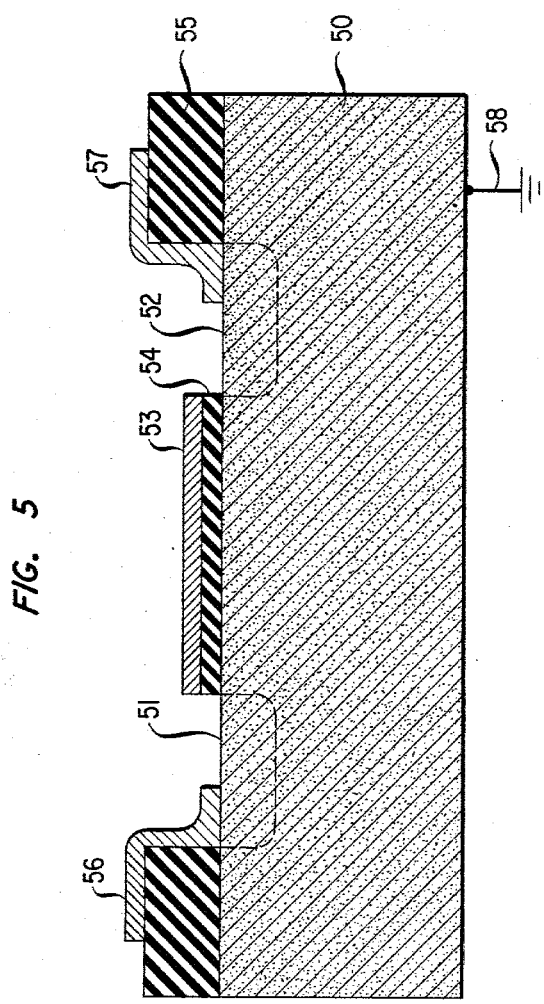

The organization of typical read only memories (ROM's) and programmable logic arrays (PLA's) are shown schematically in FIGS. 4A and 4B, respectively. In FIG. 4A, the small boxes 30 represent the programmable elements and can be considered switches. In the ROM, one uses the X and Y decoders 31, 32 to access one pair of lines to interrogate the state of the switch at the crosspoint. In the PLA of FIG. 4B a certain number of logic inputs at leads 35 are fed into an array of logic gates 36 to give a specified output at leads 37. By having the option of routing the output of one gate to the input of more than one subsequent gate, the ability to change the logic array exists.

The first step in these exemplary processes is to damage the array of devices sufficiently to degrade the carrier lifetime to the point where to operation of the devices is materially affected or the change some other physical property such as carrier concentration that can affect significantly an electrical operating characteristic of the device.

In these examples all of the devices are initially damaged and selective ones healed. One can foresee applying the technique by damaging the devices only in a selected section of an array or of a complex integrated circuit. For example, only one or the other of the IGFET or bipolar devices in a BIGFET circuit can be exposed to radiation damage. Alternatively the level of radiation can be selected so as to affect one type of device more than another so that a non-selective exposure produces a selective result.

The effect of various kinds of radiation on semiconductors, and in particular on minority carrier lifetime, is well established. The minority carrier lifetime degradation is directly proportional to the damage radiation fluence. Majority carrier removal is, similarly, proportional to the defect concentration for compensating defects. The lifetime, T, for moderate injection levels, is related to the defect concentration, N as: $T \approx (1/\sigma vN)$, where $\sigma$ is the minority carrier capture cross section and v is the thermal velocity of the carrier. Thus T recovers as $1/N$. As a further example demonstrating the invention we will describe electronically annealing a typical JFET.

Assume the JFET is silicon with a n-channel conductivity of $1\Omega cm$ or $5 \times 10^{15}$ phosphorus atoms/cm$^3$ and a channel depth of 2 $\mu m$. The gate is a single junction conventional structure and the pinch-off or threshold voltage for this channel is 15 volts. The channel is damaged with 1 MeV electrons with a flux $\phi$ of $1.6 \times 10^{16}$ e/cm$^2$. This damage is sufficient to remove majority carriers at a rate $dn/d\phi = 0.25$ cm$^{-1}$ giving an effective majority carrier concentration in the channel of $1 \times 10^{15}$/cm$^3$. The threshold voltage corresponding to this carrier concentration is approximately 3 volts.

By electronically annealing with a gate voltage of e.g., 10 v (3 volts is adequate to initiate annealing but as annealing proceeds this voltage will then no longer fully deplete the channel) and a temperature of 100° C., 50% of the effective trapping defects are removed after $10^4$ sec (essentially all of the E-center are annealed out). This leaves an effective majority carrier concentration of $3 \times 10^{15}$/cm$^3$ and a threshold voltage of 7 volts. The threshold voltage of an unbiased device during this treatment stays essentially at 3 volts. Thus we have demonstrated now, by electrically addressing a selected transistor, one can affect significantly an important device parameter namely the threshold voltage.

This same calculation is applicable to MOSFETs, MOS capacitors, charge transfer devices and diodes.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. A method for programming an array of MOS devices formed in a semiconductor crystal, the semiconductor selected from the group consisting of silicon or gallium arsenide, where each of the devices includes attached electrodes the method comprising:

exposing the array to radiation with an energy exceeding the threshold for displacement damage to the semiconductor crystal and form a sufficient number of defects with energy states lying within the band gap of the semiconductor to alter the electrical characteristics of the MOS devices in the array, and applying a voltage to the electrodes of selected devices in the MOS array of a value and for a sufficient period to restore substantially the original electrical characteristics of the selected devices by healing the radiation damage to those devices.

2. A method of claim 1 in which the MOS devices include at least one p-n junction and the radiation damage is healed by injecting carriers across the junction in an amount at least equal to two orders of magnitude less than the lowest majority carrier concentration.

3. The method of claim 1 in which the MOS devices include field effect transistors, the radiation damage alters the gate threshold of the field effect transistors by at least 50%, and the gate threshold of selected devices in the array is restored by applying a forward bias to one or both of the source and drain junctions of the devices selected.

4. The method of claim 1 in which the MOS devices include field effect transistors, the radiation alters the gate threshold of the field effect transistors by at least 50%, and the gate threshold of selected devices in the array is restored by applying a varying voltage to the gates of the devices selected sufficient to repeatedly inject minority carriers into the region of the semiconductor below the gate.

5. The method of claim 1 in which the MOS devices include field effect transistors, the radiation alters the gate threshold of the field effect transistors by at least 50% and the gate threshold of selected devices in the array is restored by applying a reverse bias to the gate of the devices selected.

6. The method of claim 1 in which the MOS devices include a gate element and the radiation damage is healed by applying a reverse bias to the gate of the 4 devices selected.

7. The method of claim 1 in which the semiconductor is silicon.

8. The method of claim 1 in which the semiconductor is GaAs.

9. The method of claim 1 in which the crystal is exposed to electrons or gamma rays with an energy of less than 10 MeV.

10. The method of claim 1 in which the crystal is exposed to protons or alpha particles.

11. The method of claim 7 including the additional step of heating the silicon crystal to a temperature between room temperature and 200° while the voltage is applied.

12. The method of claim 8 including the additional step of heating the GaAs crystal to a temperature between room temperature and 250° while the voltage is applied.

13. A method for programming an array of semiconductor devices formed in a semiconductor crystal where each of the devices includes attached electrodes, the method comprising exposing the array to radiation capable of causing displacement damage to the semiconductor crystal, and healing at least part of the radiation damage of selected devices in the array by exposing the selected devices to an electron beam.

14. The method of claim 13 in which the semiconductor crystal is a gallium compound semiconductor.

15. The method of claim 14 in which the semiconductor crystal is silicon.

16. The method of claim 15 including the concurrent step of heating the crystal to a temperature of at least approximately 100° C. while the voltage is applied.

* * * * *

UNITED STATES PATENT AND TRADEMARK OFFICE
CERTIFICATE OF CORRECTION

PATENT NO. : 4,238,694

DATED : December 9, 1980

INVENTOR(S) : Lionel C. Kimerling, Harry J. Leamy and George E. Smith

It is certified that error appears in the above—identified patent and that said Letters Patent is hereby corrected as shown below:

Column 3, line 30, "155" should read --$\leq$--. Column 4, line 10, "slicon" should read --silicon--. Column 8, line 1, "of" should read --to--; line 42, ">" should read --<--.

Claim 6, line 3, delete "4".

Signed and Sealed this

*Thirty-first* Day of *March 1981*

[SEAL]

*Attest:*

RENE D. TEGTMEYER

*Attesting Officer*      *Acting Commissioner of Patents and Trademarks*